United States Patent [19]

Sakata

[11] Patent Number: 5,355,349

[45] Date of Patent: Oct. 11, 1994

[54] SEMICONDUCTOR INTEGRATED CIRCUIT DEVICE

[75] Inventor: Toshikazu Sakata, Miyazaki, Japan

[73] Assignee: Oki Electric Industry Co., Ltd., Tokyo, Japan

[21] Appl. No.: 992,120

[22] Filed: Dec. 17, 1992

[30] Foreign Application Priority Data

Dec. 19, 1991 [JP] Japan .................................. 3-336439
Dec. 19, 1991 [JP] Japan .................................. 3-336442

[51] Int. Cl.$^5$ ............................................. G11C 11/34
[52] U.S. Cl. ............................. 365/233.5; 365/189.07; 365/189.05
[58] Field of Search ................ 365/233, 233.5, 194, 365/194, 191, 189.01, 189.07, 189.05

*Primary Examiner*—Joseph A. Popek
*Attorney, Agent, or Firm*—Edward D. Manzo

[57] ABSTRACT

In a semiconductor integrated circuit device, a sense amplifier (30A) is capable of operating selectively with a First operating point (VR1) or with a second operating point (VR2) at the time of address change. A control circuit (80) detects the output data output at the preceding read cycle and causes the sense amplifier to operate with said first operating point in accordance with the output data of the preceding read cycle. A match detecting circuit (210) may be provided to generate a match signal or a mismatch signal depending on whether or not the input and output of a data input delay circuit (200) match each other. When the mismatch signal is generated, a transfer gate (220) is turned off and a latch circuit is made operative so that the write data of the preceding cycle is held on a write data line connected to the output of the transfer gate.

5 Claims, 11 Drawing Sheets

PRIOR ART

SEMICONDUCTOR INTEGRATED CIRCUIT DEVICE

BACKGROUND OF THE INVENTION

The present invention relates to a semiconductor integrated circuit device, such as a semiconductor memory device, e.g., a static random access memory (SRAM) having memory cells.

In a conventional semiconductor memory device, memory cells are arranged to form a matrix, and one of the memory cells is selected through selection of one of the word lines and one of the pairs of bit lines, and the data is read from or written in the selected memory cell. This is described in more detail with reference to FIG. 1 and FIG. 2.

Figure 1:
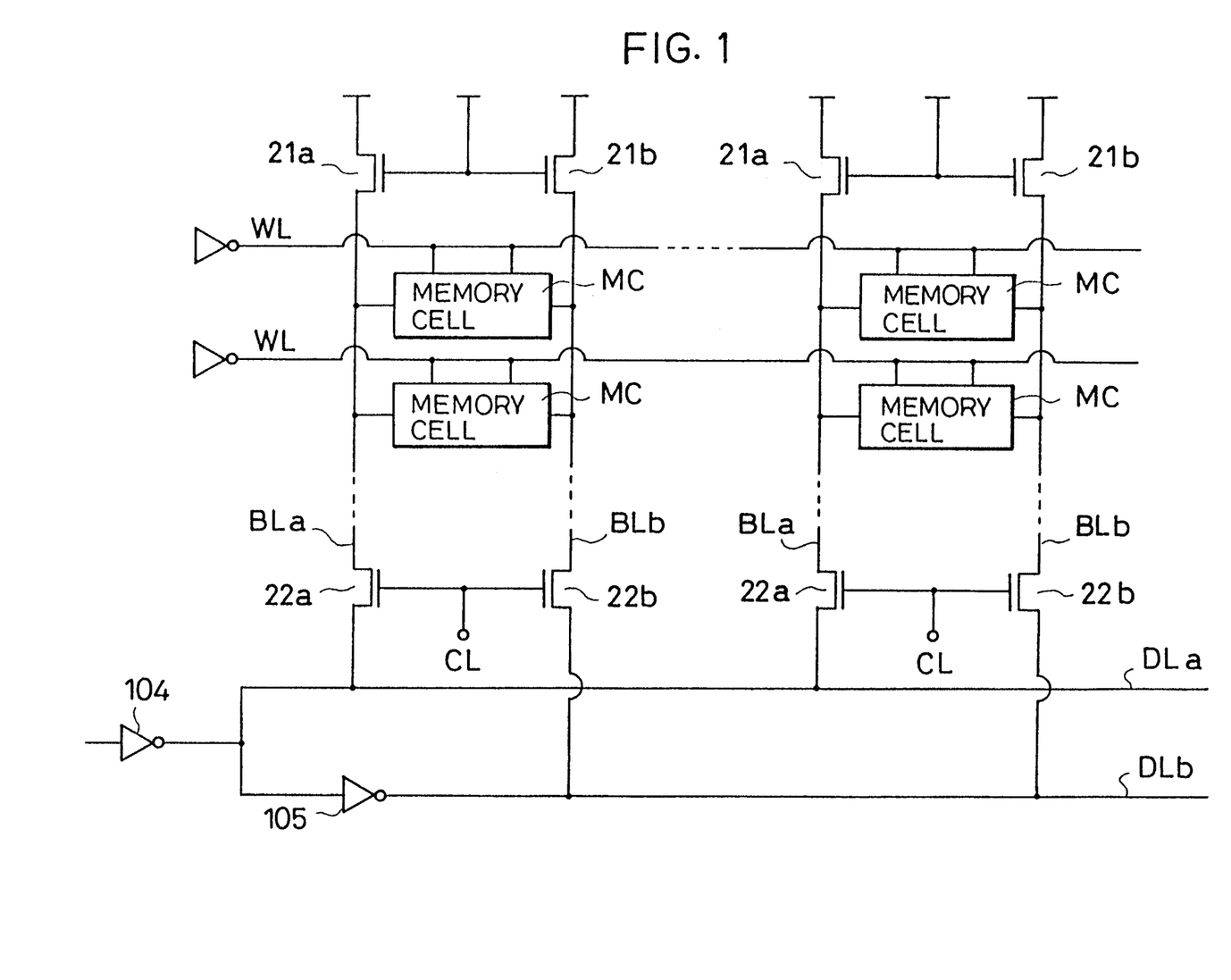
FIG. 1 is a diagram showing a memory cell matrix part of a semiconductor memory device.
Figure 1A:
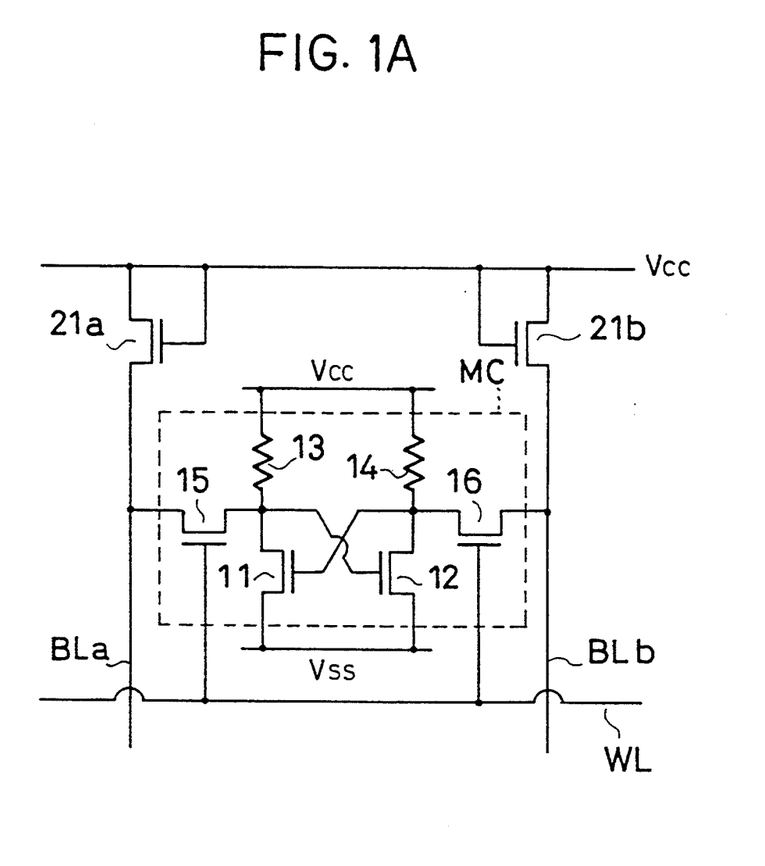
FIG. 1A is a diagram showing a circuit configuration of a single memory cell.

FIG. 1 shows part of the circuit of a conventional semiconductor memory device, which is an SRAM. It has a plurality of word lines WL. (only two being illustrated), and a plurality of pairs of bit lines BLa, BLb (only two pairs being illustrated). The word lines WL and bit lines BLa and BLb are selected in accordance with an address. Memory cells MC (only four being illustrated), are disposed at intersections between the word lines and the bit lines, arranged to form a matrix, and connected to the word lines and the bit lines. As illustrated In FIG. 1A, each of the memory cells MC comprises a flip-flop circuit including a pair of n-channel metal-oxide-silicon (n-channel MOS or NMOS) transistors 11 and 12 which are cross-coupled with each other, i.e., each having its gate electrode connected to the drain electrode of the other transistor. The drains of the transistors 11 and 12 are connected via load resisters 13 and 14 to a power supply node Vcc. The sources of the transistors 11 and 12 are connected to a ground potential node Vss. The transistors 11 and 12 are also connected to a pair of complementary bit lines BLa and BLb via switching means in the form of NMOS transistors 15 and 16.

Referring to FIG. 1, one ends of the pair of bit lines BLa and BLb are connected to the power supply node Vcc via NMOS transistors 21a and 21b acting as load resistors. The other ends of the bit lines are connected to a pair of complementary data lines DLa and DLb via transfer gates in the form of NMOS transistors 22a and 22b, which are turned on and off by column lines CL selected by an address.

Figure 2:
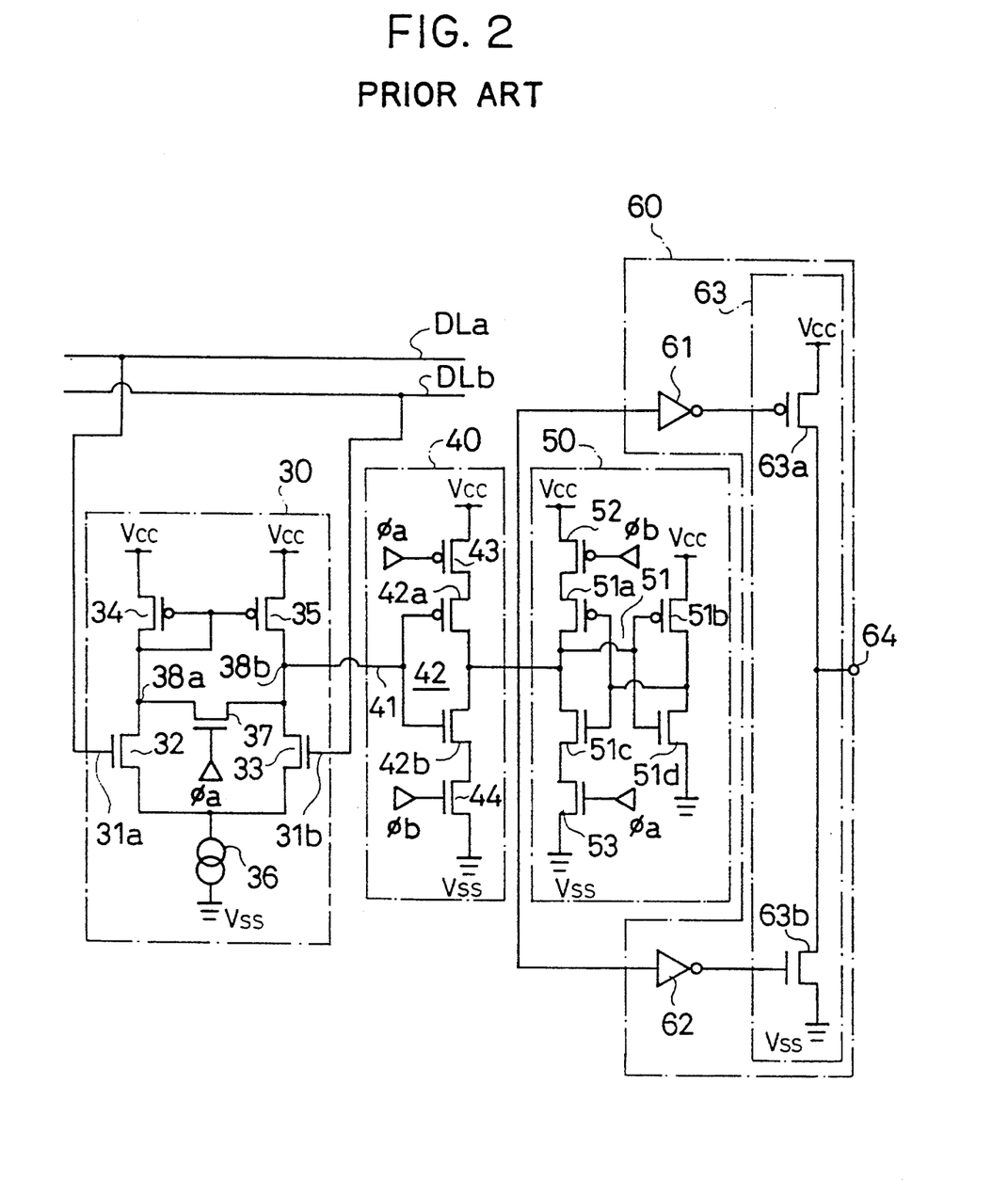
FIG. 2 is a diagram showing a conventional read circuit.

As illustrated in FIG. 2, the pair of data lines DLa and DLb are connected to non-inverted input node 31a and inverted input node 31b of a sense amplifier 30 for sensing and amplifying the potential difference between the pair of bit lines. The sense amplifier 30 comprises NMOS transistors 32 and 33 forming a differential amplifier having their gates controlled by input to the non-inverted input node 31a and inverted input node 31b. Drains of the NMOS transistors 32 and 33 are connected to the power supply node Vcc via p-channel MOS (PMOS) transistors 34 and 35 acting as loads. Sources of the NMOS transistors 32 and 33 are connected to the ground node Vss via a constant current source 36. Output nodes at the drains of the NMOS transistors 32 and 33 are connected together via a resetting NMOS transistor 37 which is turned on and off by an address change detection signal ∅a. When the resetting NMOS transistor 37 is on the output nodes 38a and 38b are connected together and the sense amplifier 30 is thereby reset. The address change detection signal ∅a is active at the time of address change, to turn on the NMOS transistor 37 thereby resetting the sense amplifier 30.

The output node 38b of the sense amplifier 30 is connected to an input node 41 of an output transfer gate 40. An output node of the output transfer gate 40 is connected an output latch circuit 50 and an output circuit 60. The output transfer gate 40 is controlled by complementary address change detection signals ∅a and ∅b and transfer the sense amplifier output to the output circuit. It comprises a complementary MOS (CMOS) inverter comprising a PMOS transistor 42a and an NMOS transistor 42b for inverting the potential at the input node 41. The output transfer gate 40 further comprises a PMOS transistor 43 and an NMOS transistor 44 which are turned on and off responsive to the address change detection signals ∅a and ∅b.

The output latch circuit 50 which is connected to the output node of the output transfer gate 40 is controlled by the address change detection signals ∅a and ∅b and latches the output data. It comprises a flip-flop (FF) 51 connected to the output node 45, and a PMOS transistor 52 and an NMOS transistor 53 whose gates are controlled by the address change detection signals ∅a and ∅b. The flip-flop 51 comprises a first series circuit of a PMOS transistor 51a and an NMOS transistor 51c, and a second series circuit of a PMOS transistor 51b and an NMOS transistor 51d, wherein the PMOS and NMOS transistors 51a to 51d are cross-coupled.

The output circuit 60 connected to the output node 45 of the output transfer gate 40 comprises inverters 61 and 62 for inverting the potential of the output node 45, and an output buffer 63 driven by the inverters 61 and 62. The output buffer 63 comprises a PMOS transistor 63a and an NMOS transistor 63b connected in series between the power supply node Vcc and the ground potential node Vss, and the junction between them is connected to an output node 64.

Figure 3:
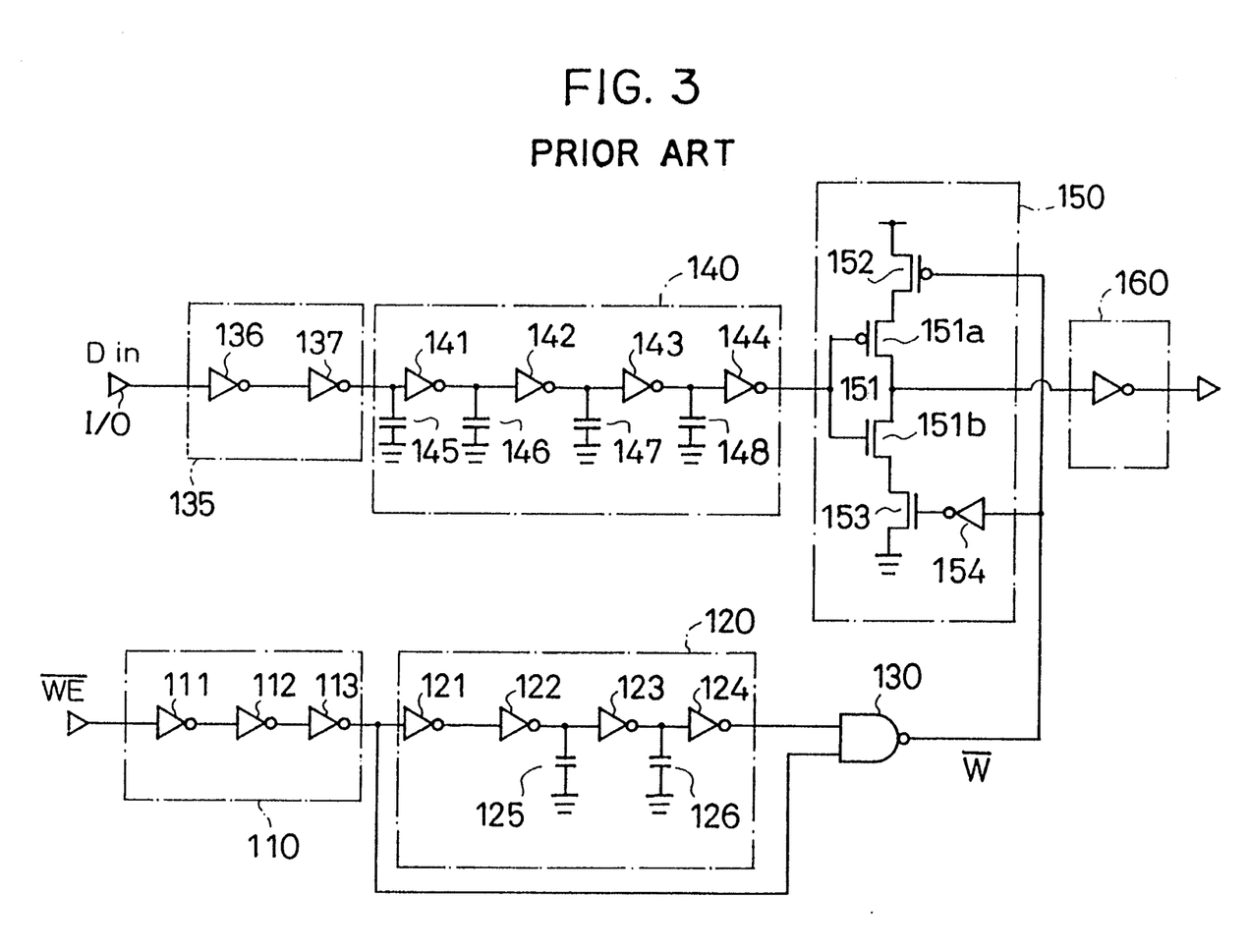
FIG. 3 is a diagram showing a conventional write control circuit.

Referring again to FIG. 1, the data lines DLa and DLb are also connected, at first ends thereof, to a write control circuit, an example of which is shown in FIG. 3, via inverters 104 and 105.

As illustrated in FIG. 3, the write control circuit comprises a buffer circuit 110 comprising a plurality of cascaded inverters 111 to 113 and inverting the inverted write enable signal $\overline{WE}$, and a write enable delay circuit 120 and a two-input NAND gate 130 which are connected to the output of the buffer circuit 110. The write enable delay circuit 120 delays the inverted write enable signal $\overline{WE}$ for a predetermined time and comprises cascaded inverters 121 to 124, and capacitors 125 and 126. The two-input NAND gate 130 determines the inversion of the logical product of the output of the write enable delay circuit 120 and the output of the buffer circuit 110, and generates an inverted internal write enable signal $\overline{W}$.

The input data Din for use in writing data is passed through a buffer circuit 135 comprising two cascaded inverters 136 and 137, and the output of the buffer circuit 135 is connected to the data input delay circuit 140. The data input delay circuit 140 delays the input data Din for a predetermined time, and generates an internal input data D, and comprises cascaded inverters 141 to 144, and capacitors 145 to 148. The output of the data input delay circuit 140 is connected through a transfer gate 150 to a write amplifier 160.

The transfer gate 150 comprises a CMOS inverter 151 comprising a PMOS transistor 151a and an NMOS transistor 151b and inverting the internal input data D, and a PMOS transistor 152 and an NMOS transistor 153 turning on and off the current flowing through the inverter 151, and an inverter 154 for inverting the inverted internal write enable signal $\overline{W}$ and applying its output to the gate of the NMOS transistor 153 to control the NMOS transistor 153. The PMOS transistor 152 is turned on and off by the inverted internal write enable signal $\overline{W}$. The output of the CMOS inverter 151 is connected to the write amplifier 160 which amplifies the output of the inverter 151 and supplies it to the inverter 104.

Figure 4:
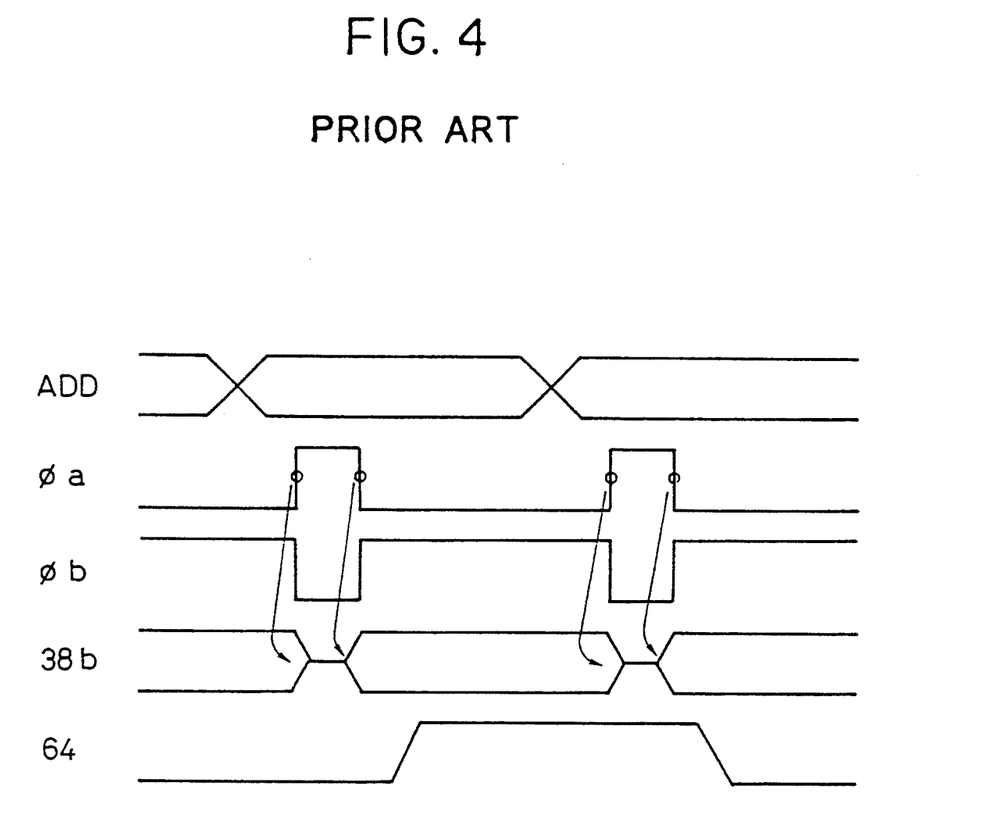
FIG. 4 is a waveform diagram showing the signals at various parts in FIG. 2.

Reading operation of the semiconductor memory device of FIG. 2 will now be described with reference to FIG. 4, which shows waveforms of signals at various parts of the circuit of FIG. 2.

When a reading cycle starts, and transition takes place in the address ADD, then the transition is detected by an address change detection circuit, not shown, and the address change detection signals ∅a and ∅b are generated. Then, the address change detection signal ∅a goes High, and the address change detection signal ∅b goes Low. The NMOS transistor 37 in the sense amplifier 30 is turned on and the output nodes 38a and 38b are short-circuited to each other. The output potentials approach the operating point of the sense amplifier 30. Moreover, the PMOS transistor 43 in the output transfer gate 40 is turned off and the NMOS transistor 44 is turned on, so that output node 45 of the output transfer gate 40 is brought into a floating state. Furthermore, the PMOS transistor 52 in the output latch circuit 50 is turned on and the NMOS transistor 54 is turned on, so the FF 51 is operative, to hold the output data derived during the preceding reading cycle, as long as the address change detection signal ∅a is High. The data derived during the preceding is therefore kept outputted at the output node 64 of the output buffer 63.

When transition takes place in the address, the selected word line WL goes High and the selected column line CL goes High, so that the memory cell MC connected to the selected word line WL and the selected column line CL is selected. The NMOS transistors 15 and 16 in the memory cell MC are turned on and the stored data is outputted to the pair of bit lines BLa and BLb. Since the NMOS transistors 22a and 22b are on, the stored data read out of the memory cell MC is passed through the data lines DLa and DLb to the sense amplifier 30.

When the address change detection signal ∅a changes from High to Low, the resetting NMOS transistor 37 in the sense amplifier 30 is turned off and the sensing and amplifying operation of the sense amplifier 30 is started. When the address change detection signal ∅a goes Low and the address change detection signal ∅b goes High, the PMOS transistor 43 and the NMOS transistor 44 in the output transfer gate 40 are turned on and the output of the sense amplifier 30 is passed through the CMOS inverter 42 to the inverters 61 and 62, which respectively invert the output of the output transfer gate 40 and causes the output buffer 63 to operate. An output data then appears at the output node 64 of the output buffer 63, and the reading operation is thus completed. The PMOS transistor 52 and the NMOS transistor 53 of the output latch circuit 50 are both off, so that the FF 51 is in the inactive state and does not give any effect on the output data.

Now, writing operation is next described with reference to FIG. 5, in which $t_{wc}$ denotes a write cycle time, $t_{as}$ denotes an address set-up time, $t_{dh}$ denotes a data hold time (write margin), R denotes the time at which the word line WL is activated (e.g., made to rise). The reference numeral 161 shown a waveform that is obtained when there is no erroneous writing, while reference numeral 162 denotes a waveform that is obtained when there is a possibility of an erroneous writing.

Upon expiration of address set up time $t_{as}$ after transition of address AD, the inverted write enable signal $\overline{WE}$ goes Low. When the inverted write enable signal $\overline{WE}$ goes Low, this is delayed by the write enable delay circuit 120. When input data Din is set up, the input data Din is delayed by the data input delay circuit 140.

The inverted write enable signal $\overline{WE}$ is delayed by the write enable delay circuit 120 for a predetermined time, and the inverted internal write enable signal $\overline{W}$ outputted from the two-input NAND gate 130 goes Low, and the PMOS transistor 152 and the NMOS transistor 153 in the transfer gate 150 are turned on, and the inverter 151 is made operative. The input data Din is delayed by the data input delay circuit 140, and the delayed internal input data D is inverted by the inverter 151 and amplified by the write amplifier 160, and passed through the inverters 104 and 105, whose outputs, which are complementary, are supplied to the data lines DLa and DLb.

Figure 5:
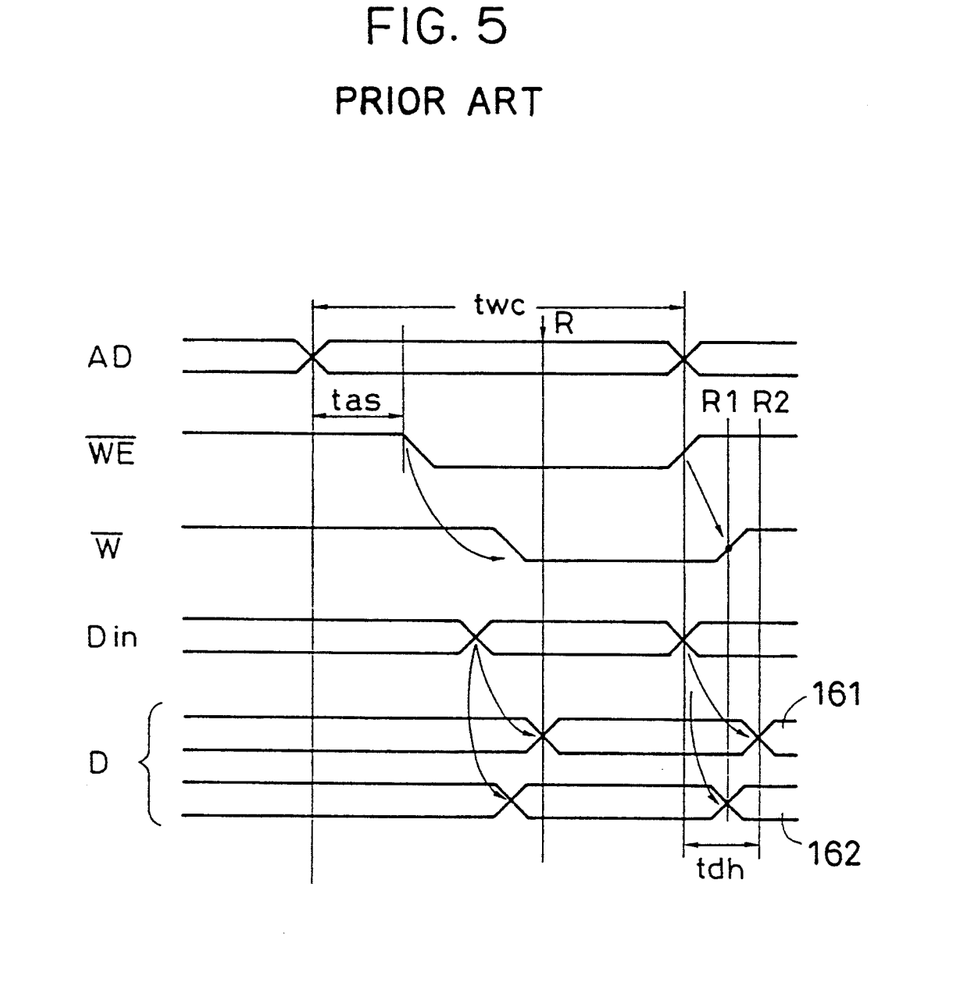
FIG. 5 is a waveform diagram showing the signals at various parts in FIG. 3.

The address AD is decoded by a decoder, not shown, and the selected word line WL rises at point R in FIG. 5, and the selected memory cell MC is made accessible. When the inverted write enable signal $\overline{WE}$ rises, it is transmitted to the buffer circuit 110 and the two-input NAND gate 130, and the inverted internal write enable signal $\overline{W}$ outputted from the two-input NAND gate 130 goes High and the PMOS transistor 152 and the NMOS transistor 153 in the transfer gate 150 are turned off, and the inverter 151 is turned off. As a result, the write data on the data lines DLa and DLb is written in the selected memory cell MC through the transfer gates 22a and 22b selected by the column line CL.

The reason why the write enable delay circuit 120 and the data input delay circuit 140 are provided in the memory write control circuit is as follows:

For instance, If the word lines WL goes High at time point R in FIG. 5, after the inverted write enable signal $\overline{WE}$ goes Low, the memory cell MC is selected by the previous address until the point R, so if there occurs transition of the input data Din before the time point R, the new input data is written in the memory cell MC selected by the previous address. To avoid this, the write enable delay circuit 120 and the data input delay circuit 140 are provided to delay the inverted write enable signal $\overline{WE}$ and the input data Din so that they are in time with the rise of the word line WL.

The above described reading circuit did not meet with the requirements of increase in the reading speed, and simplification in the design of the reset timing of the sense amplifier. This is explained next.

In the circuit of FIG. 2, the output node 64 varies only at the termination of the address change detection signal ∅a, so that speed of operation is limited depending on the timing of the address change detection signal ∅a. Moreover, the sense amplifier 30 approaches its operating point whenever it is reset, so that it is possible that erroneous output may be generated depending on the output of the preceding cycle.

The write control circuit described above has the following shortcomings:

As shown in FIG. 3, since the write enable delay circuit 120 and the data input delay circuit 140 are provided in the memory write control circuit to delay the inverted write enable signal $\overline{WE}$ and the input data Din for respective predetermined times so that they are in time with the rise of the word line, it is difficult to ensure sufficient data hold time $t_{dh}$ (write margin). As a result, erroneous writing may be caused if the inverted internal write enable signal $\overline{W}$ rises too late or the transition of the internal input data D is too early.

That is, if the inverted internal write enable signal $\overline{W}$ goes High before time point R2 in FIG. 5, the internal input data the the time of the rise is written in the selected memory cell MC, so that erroneous writing does not occur as indicated in the waveform 161. If however the inverted internal write enable signal $\overline{W}$ rises after time point R1, due for instance to the variation in the circuit constants erroneous writing may occur as indicated in waveform 162.

SUMMARY OF THE INVENTION

An object of the invention is to alleviate the requirement on the timing of the control signals and to eliminate the possibility of the erroneous output.

Another object of the invention is to reduce the possibility of erroneous writing due to insufficient data hold time.

According to one aspect of the invention, there is provided a semiconductor integrated circuit device comprising:
- a plurality of memory cells (MC) connected to a plurality of word lines (WL) and a plurality of pairs of bit lines (BLa, BLb) which are selected in accordance with an address (ADD);
- a plurality of sense amplifiers (30A) for sensing and amplifying a potential difference between a pair of bit lines, after it is reset responsive to an address change detection signal in a read cycle (cycle for reading stored data from said memory cell);
- an output circuit (60) for outputting data in accordance with the output of said sense amplifier (30A);
- said sense amplifier (30A) capable of operating selectively with a first operating point (VR1) or with a second operating point (VR2) different from said first operating point, at the time of being reset responsive to the address change detection signal;
- said first operating point (VR1) being higher than the threshold potential said output circuit and said second operating point (VR2) being lower than said threshold potential; and
- a control circuit (80) detecting the output data output at the preceding read cycle and causing said sense amplifier to operate with said first operating point in accordance with the result of said detection of the output data.

According to another aspect of the invention, there is provided a semiconductor integrated circuit device comprising:
- a plurality of memory cells (MC) connected to a plurality of word lines (WL) and a plurality of pairs of bit lines (BLa, BLb) which are selected in accordance with an address (ADD);
- a data input delay circuit (200) for delaying write data (Din) to a selected memory cell, for a predetermined time, so that the write data are outputted in time with activation of the word line (WL);
- a transfer gate (220) turned on and off in accordance with a write enable signal (WE) or an inverted write enable signal ($\overline{WE}$) and transferring the write data outputted from the data input delay circuit (200) to the bit lines (BLa, BLb);
- an match detecting circuit (210) responsive to the input and output of the data input delay circuit (200) and generating a match signal or a mismatch signal depending on whether or not the input and output of the data input delay circuit (200) match each other;
- a transfer gate control circuit (180) for controlling oil and off of the transfer gate in accordance with the output of the match circuit (210); and
- a latch circuit (230) for latching, for a predetermined time, the write data outputted from the transfer gate, when the output of the match detecting circuit (210) indicates a mismatch.

DETAILED DESCRIPTION OF THE PREFERRED EMBODIMENTS

Figure 6:
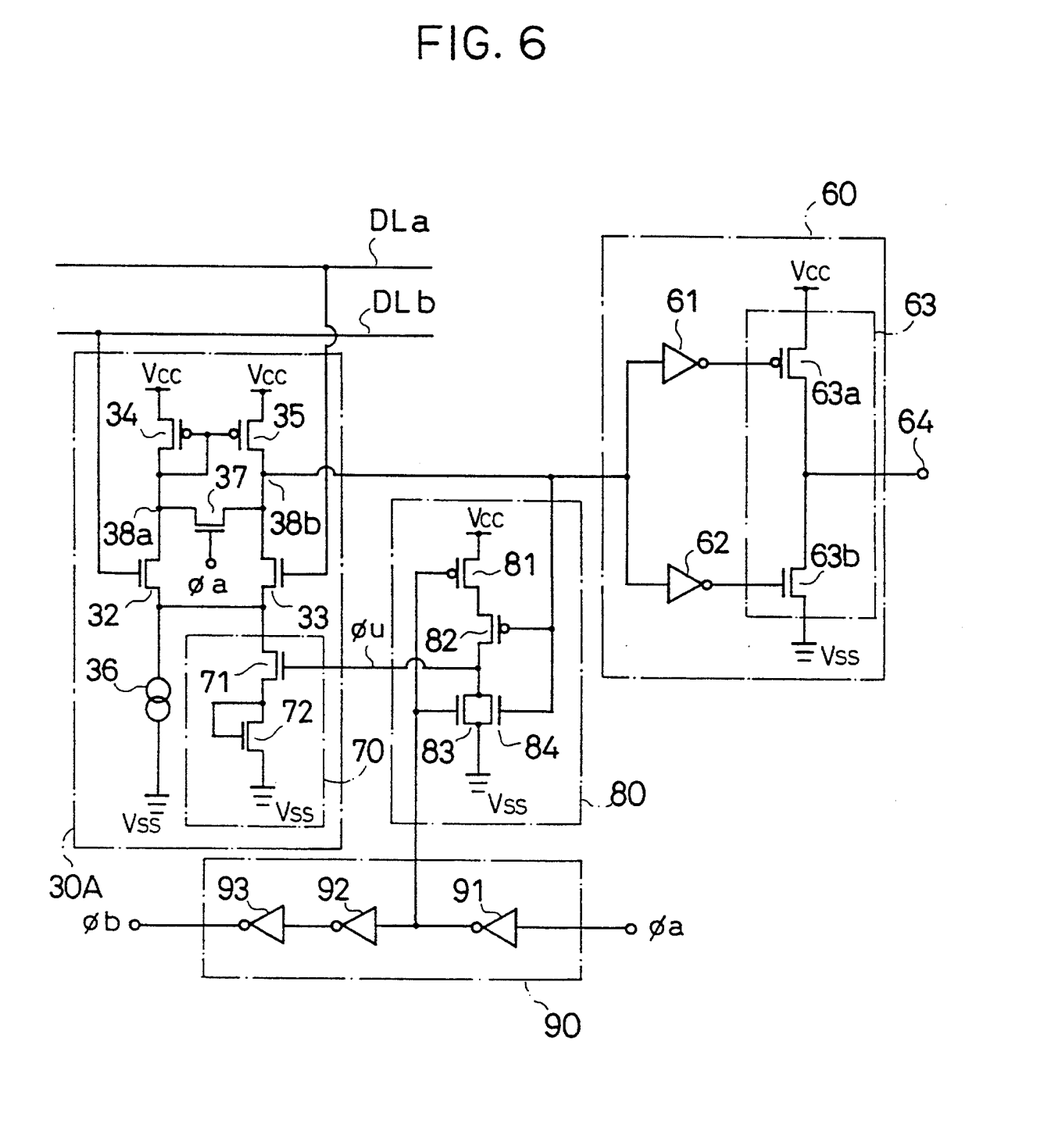
FIG. 6 is a diagram showing a read circuit of an embodiment of the invention.

FIG. 6 is a circuit diagram showing a read circuit of an embodiment of the invention. The elements identical to those in FIG. 2 are identified with identical reference numerals.

The sense amplifier 30A used in this embodiment differs from the sense amplifier 30 in the prior art of FIG. 2. As illustrated, the sense amplifier 30A comprises an NMOS transistor 32 whose gate is connected to and controlled by the data line DLb, and an NMOS transistor 33 whose gate is connected to and controlled by the data line DLa. An output node 38$a$ connected to the drain of the NMOS transistor 32 is connected to the power supply node Vcc via a PMOS transistor 34 serving as a load. Another output node 38$b$ connected to the drain of the NMOS transistor 33 is connected to the power supply node Vcc via a PMOS transistor 35 serving as a lead. The output nodes 38$a$ and 38$b$ are connected together by means of a resetting NMOS transistor 37 whose gate is controlled by an address change detection signal $\emptyset$a.

The differential amplification is achieved by the NMOS transistors 32 and 33. The sources of the NMOS transistors 32 and 33 are connected to the ground potential node Vss through a constant current source 36 for providing a first operating point (reset potential VR1), and to a setting circuit 70 for providing a second operating point (reset potential VR2). The first operating point VR1 is higher than the threshold potential Vth of the inverters 61 and 62, and is lower than Vcc. The second operating point VR2 is lower than Vth and higher than Vss. The setting circuit 70 is made operative when the data the output node 38b is Low and the address change detection signal ∅a is High, and is made inoperative at other times. When the setting circuit is operative, the operating point of the sense amplifier 30A is at VR2. When the setting circuit is inoperative, the operating point of the sense amplifier 30A is at VR1. The setting circuit 70 comprises NMOS transistors 71 and 72 connected in series between the source of the NMOS transistor 33 and the ground potential node Vss. The drain and the gate of the NMOS transistor 72 are connected together.

The output node 38b of the sense amplifier 30A is connected to the output circuit 60 in the same way as in FIG. 2, and also to a control circuit 80. The output transfer gate 40 and the output latch circuit 50 shown in FIG. 2 are not provided. The output circuit 60 comprises inverters 61 and 62 for inverting the signal on the output node 38b, and an output buffer 63 driven by the inverters 61 and 62. The output buffer 63 comprises a PMOS transistor 63a and an NMOS transistor 63b whose gates are respectively controlled by the outputs of the inverters 61 and 62. The PMOS transistor 63a and the NMOS transistor 63b are connected in series between the power supply node Vcc and the ground potential node Vss. The junction between the PMOS transistor 63a and the NMOS transistor 63b is connected to the output node 64.

The control circuit 80 is responsive to the address change detection signal ∅a outputted from an address change detection circuit, not shown, and a signal from the output node 38b of the sense amplifier 30A to detect whether the level of the output data of the preceding reading cycle is High or Low, and to generate a control signal ∅u to turn on or off the NMOS transistor 71 in the setting circuit 70, depending on the result of the detection. More specifically, the output data at the output node 38b of the preceding reading cycle is Low, and the ∅a is High, the control signal ∅u is High, and the NMOS transistor 71 is turned on and the setting circuit 70 is operative, and the operating point is VR2, which is lower than the threshold potential Vth of the inverters 61 and 62. When the output data at the output node 38b of the preceding reading cycle is High, and the ∅a is High, the control signal ∅u is Low, and the NMOS transistor 71 is turned off and the setting circuit 70 is inoperative, and the operating point is VR1, which is higher than Vth.

The control circuit 80 comprises PMOS transistors 81 and 82, and NMOS transistors 83 and 84. The source of the PMOS transistor 81 is connected to the power supply node Vcc, and the source of the PMOS transistor 82 is connected to the drain of the PMOS transistor 81. The NMOS transistors 83 and 84 are connected in parallel with each other and their sources are connected together to the ground potential node Vss, and their drains are connected together to the drain of the PMOS transistor 82. The gates of the PMOS transistor 82 and the NMOS transistor 84 are connected together to the output node 38b of the sense amplifier 30A, while the gates of the PMOS transistor 81 and the NMOS transistor 83 are connected to the output of the inverter 91, which inverts the address change detection signal ∅a.

The output of the inverter 91 is also connected to two inverters 92 and 93, and an inverted address change detection signal ∅b is outputted at the output of the inverter 93.

Figure 7:
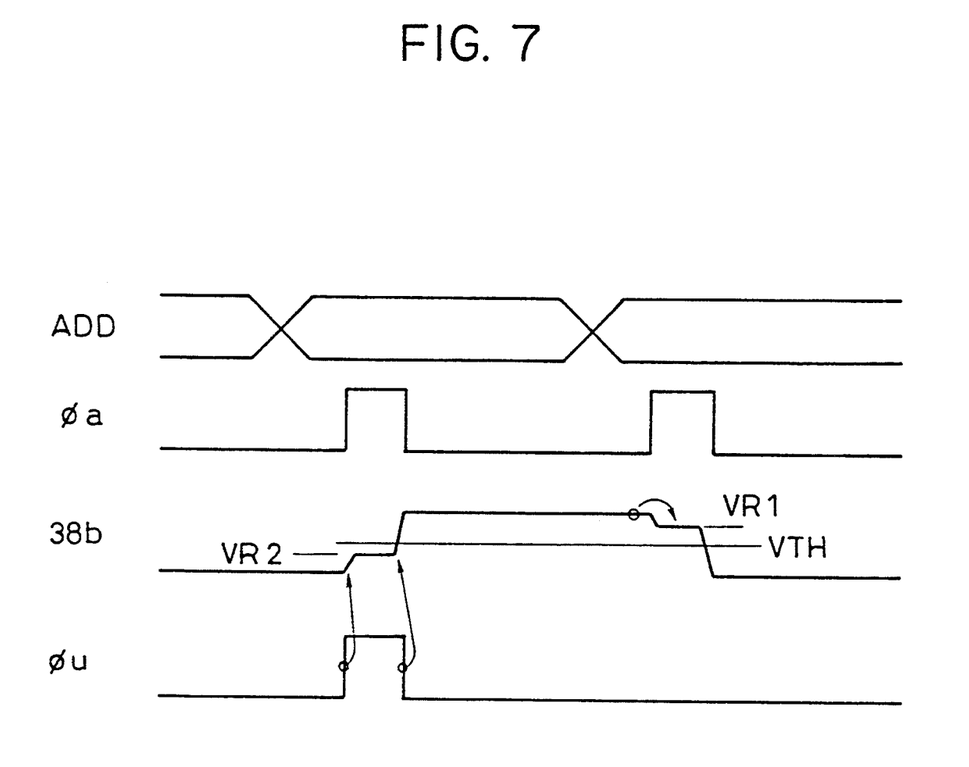
FIG. 7 is a waveform diagram showing the signals at various parts in FIG. 5.

Reading operation of the semiconductor memory device of FIG. 4 will next be described with reference to FIG. 7, which shows signals at various parts of the device FIG. 6.

First let us assume that the sense amplifier 30A is in the reset state. When the output control signal ∅u of the control circuit 80 is Low, the NMOS transistor 71 in the setting circuit 70 is off, and the operating point of the sense amplifier 30A is at the first operating point VR1. When the output control signal ∅u of the control circuit 80 is High, the NMOS transistor 71 in the setting circuit 70 is on and the operating point of the sense amplifier 30A is at the second operation point VR2.

Assume that in a reading cycle, a selected word line WL goes High and the stored data is read from a selected memory cell, and transferred via a selected pair of bit lines BLa and BLb, and a selected pair of NMOS transistors 22a and 22b to the pair of complementary data lines DLa and DLb. One of the data lines DLa and DLb goes High and the other goes Low, then one of the NMOS transistors 32 and 33 in the sense amplifier 30A is turned on and the other is turned off. If DLa goes High and DLb goes Low, the NMOS transistor 33 is turned on and the NMOS transistor 32 is turned off. As a result, the output node 38b is Low. Since the address ADD is not changing, the address change detection signal ∅a is Low, and this is inverted by the inverter 91, whose output is therefore High, and the NMOS transistor 83 in the control circuit 80 is turned on and the PMOS transistor 81 is turned off, so that the control signal ∅u outputted from the control circuit 80 is Low. When the control signal ∅u is Low, the NMOS transistor 71 in the setting circuit 70 is turned off.

Let us assume that the address changes from this state, and the data line DLa goes Low and the data line DLb goes High.

When the address changes, the address change detection signal ∅a goes High. This signal is inverted by the inverter 91, whose output therefore goes Low. By virtue of this Low signal, the PMOS transistor 81 in the control circuit 80 is turned on, and the NMOS transistor 83 is turned off, so the control signal ∅u goes High. When the control signal ∅u goes High, the NMOS transistor 71 in the setting circuit 70 is turned on and the reset potential of the sense amplifier 30A is set at the second operating point VR2. Since the threshold potential Vth of the inverters 61 and 62 is higher than VR2, the outputs of the inverters 61 and 62 are Low, and the output buffer 63 keeps outputting the output data of the preceding read cycle.

When the address change detection signal ∅a goes Low, the NMOS transistor 37 in the sense amplifier 30A is turned off and the resetting is terminated, and the sense amplifier 30A then senses and amplifies the data on the data lines DLa and DLb read from the memory cell in the read cycle in question, i.e., current read cycle, and the amplified data is outputted from the output node 38b. This output data is inverted by the inverters 61 and 62, and the output data is outputted at the output node 64 of the output buffer 63. Thus, the sense amplifier 30A begins amplifying the data on the data lines DLa and DLb after the resetting is completed. Moreover, until the resetting is completed, the data of the preceding cycle is kept outputted by virtue of the operation of the control circuit 80, and the setting circuit 70. Accordingly, erroneous output is avoided.

When the data changes in the way reverse to that described above, the output control signal ∅u of the control circuit 80 is Low, and the setting circuit 70 is inoperative, so that the reset potential of the sense amplifier 30A is set at the second operating point VR1. Because Vth<VR1, the outputs of the inverters 61 and 62 are Low, and thus keeps outputting the output data of the preceding read cycle.

As has been described, according to the above embodiment, the output latch circuit 50 of the prior art which operates during the resetting of the sense amplifier is omitted, and the sense amplifier and the output circuit 60 are not separated by the output transfer gate 40, unlike the prior art, so that the erroneous output of the output data prevented without fall. Moreover, since the erroneous output is prevented, the speed of reading can be increased. Furthermore, since the output transfer gate 40 and the output latch circuit 50 of the prior art can be omitted, the circuit configuration is simplified.

The embodiment was described in connection with an SRAM (static-random access memory), but is also applicable to other types of semiconductor memory devices. The memory cells MC may be of any other configuration, and the sense amplifier may be formed of other types of transistors. The setting circuit 70 and the control circuit 80 may be formed off other types of transistors.

Figure 8:
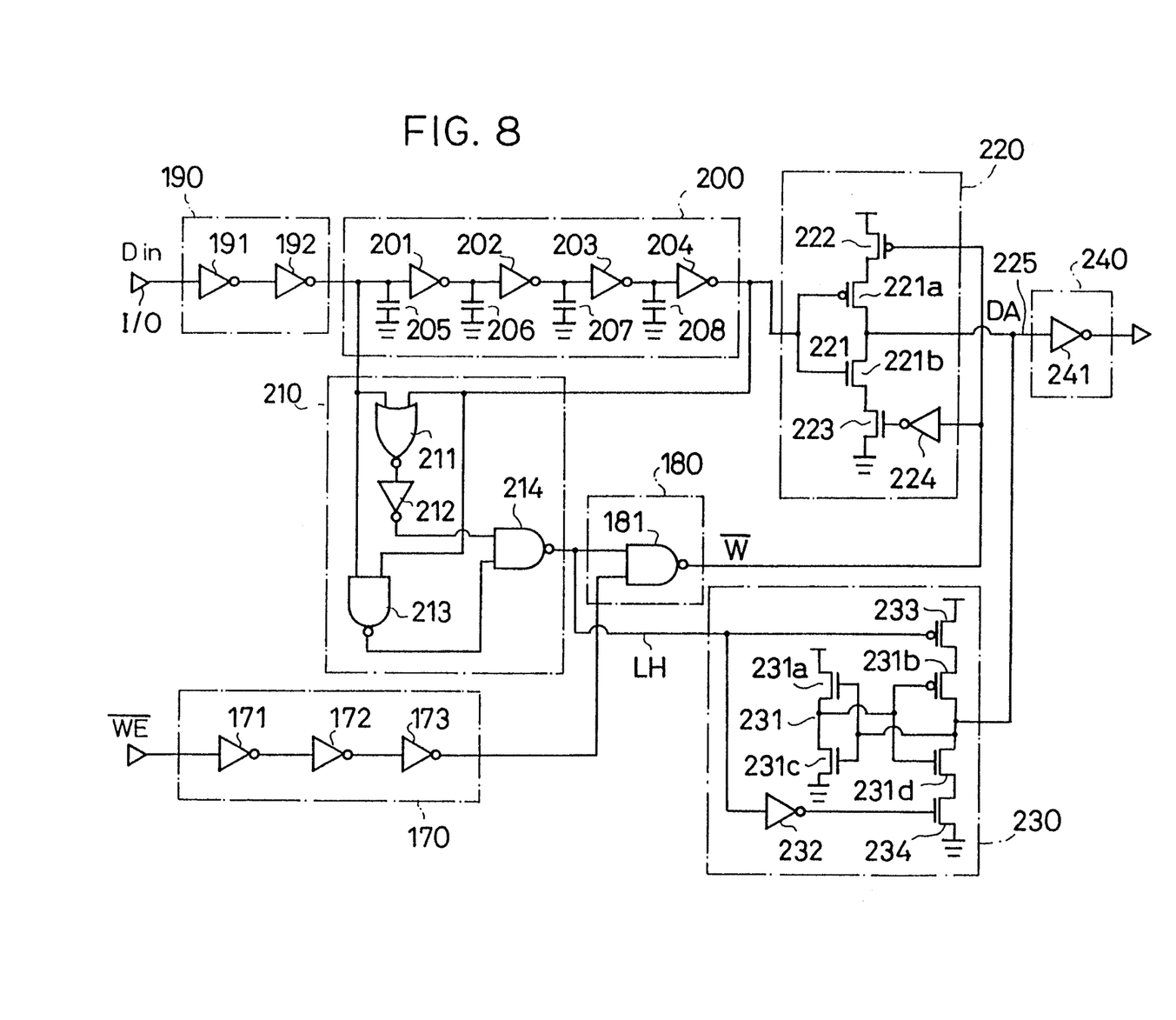
FIG. 8 is a diagram showing a write control circuit of another embodiment of the invention.

FIG. 8 shows a write control circuit of another embodiment of the invention. It serves to control writing of the memory matrix shown in FIG. 1. It comprises a buffer circuit 170 comprising a plurality of cascaded inverters 171 to 173 and a transfer gate control circuit 180 connected to the output of the buffer circuit 170. The transfer gate control circuit 180 comprises a two-input NAND gate 181, for example.

Another buffer circuit 190 comprising a plurality of cascaded inverters 191 and 192 are for receiving the input data Din at an input/output terminal I/O. A data input delay circuit 200 is connected to the output of the buffer circuit 190. The data input delay circuit 200 is for delaying the input data Din so that it is in time with the time of activation (e.g., the time of rising) of the word line WL. A match detecting circuit 210 is connected to receive the input and the output of the data input delay circuit 200. A transfer Mate 220 is connected to the output off the data input delay circuit 200. The match detecting circuit 210 detects whether or not the input and the output off the data input delay circuit 200 match each other, and generates a match signal or a mismatch signal depending on the result of the detection. That is, when the match is found, the output of the match detecting circuit 210 is High. In this state, the match detecting circuit is regarded as producing a match signal (which is High when active). When the match is not found, the output of the match detecting circuit is Low. In this state, the match detecting circuit is regarded as producing a mismatch signal or a latch signal LH (which is Low when active). The output of the match detecting circuit 200 is supplied to the transfer gate control circuit 180.

The transfer gate 220 controls the writing and reading in accordance with the inverted internal write enable signal W outputted from the transfer gate control circuit 180. It comprises a CMOS inverter 221 formed of a PMOS transistor 221a and an NMOS transistor 221b for inverting the output of the data input delay circuit 200. It also comprises a PMOS transistor 222 and an NMOS transistor 223 which control the supply of current to the inverter 221, and an inverter 224 for inverting the inverted internal write enable signal $\overline{W}$ and supplies its output to the gate of the NMOS transistor 223 to control the NMOS transistor 223. The gate of the PMOS transistor 222 Is connected to receive the inverted internal write enable signal $\overline{W}$, so that the PMOS transistor 222 is controlled by the inverted internal write enable signal $\overline{W}$. The transfer gate 220 has the function of outputting the write data DA onto the write data line 225.

The write data line 225 is connected to the latch circuit 230 and the write amplifier 240. The latch circuit 230 holds the write data DA of the preceding cycle while the match detecting circuit 210 is outputting a mismatch signal (latch signal) LH. The write amplifier 240 amplifies the write data DA and supplies it through the inverters 104 and 105 to the data lines DLa and DLb.

The data input delay circuit 200 comprises a plurality off cascaded inverters 201 to 204, and capacitors 205 to 208. The match detecting circuit 210 comprises a two-input NOR gate 211 for determining the inversion of the logical sum of the input and output off the data input delay circuit 200, and an inverter 212 for inverting the output of the NOR gate 211, and a two-input NAND gate 213 for determining the inversion of the logical product of the input and output of the data input delay circuit 200, and another two-input NAND gate 214 for determining the inversion of the logical product of the outputs of the inverter 212 and the NAND gate 213. The output of the match detecting circuit 210 is High when the input and the output of the data input delay circuit 200 match each other, and is Low when the input and the output do not match each other. The output of the NAND gate 214 is the match signal when it is High, or is the mismatch signal when it is Low. The mismatch signal (latch signal) LH from the NAND gate 214 is supplied to the latch circuit 230.

The latch circuit 230 comprises a flip-flop comprising PMOS transistors 231a, 233b, and NMOS transistors 231c and 231d cross-coupled with each other in the illustrated manner. The latch circuit 230 further comprises an inverter 232 for inverting the latch signal LH, a PMOS transistor 233 whose gate is controlled by the latch signal LH, an NMOS transistor 234 whose gate is controlled by the output of the inverter 232. The PMOS transistor 233 and the NMOS transistor 234 have the function of controlling the latching operation of the flip-flop 231 responsive to the latch signal LH. That is, when they are on, the latch circuit 230 is operative, while when they are off, the latch circuit 230 is inoperative.

Figure 9:
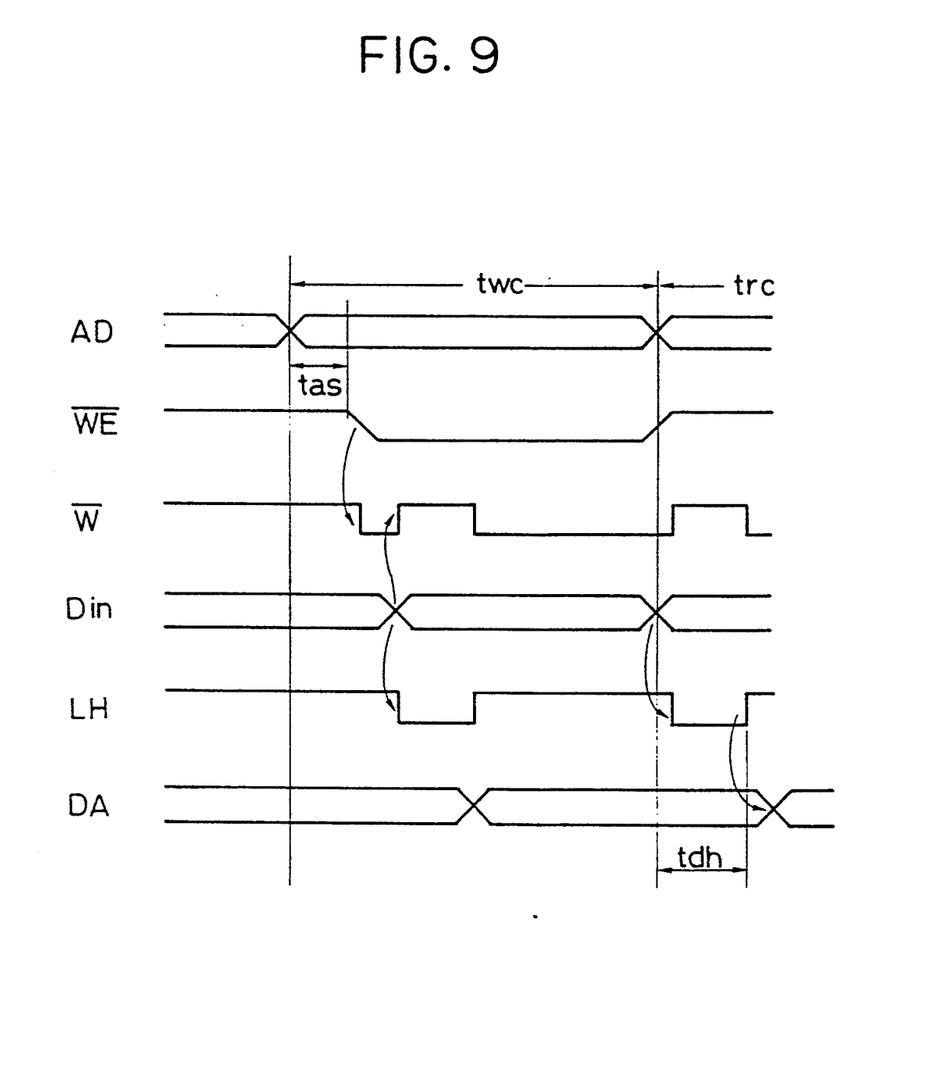
FIG. 9 is a waveform diagram showing the signals at various parts in FIG. 8.

The operation will now be described with reference to FIG. 9, as well as FIG. 8. $t_{wc}$ denotes a write cycle time, $t_{as}$ denotes an address set-up time, $t_{dh}$ denotes data-hold time, and $t_{rc}$ denotes the read cycle time.

When transition occurs in the address AD, and the write cycle time $t_{wc}$ is entered, after set-up time $t_{as}$, the inverted write enable signal $\overline{WE}$ goes Low. When the inverted write enable signal $\overline{WE}$ goes Low, the inverted internal write enable signal $\overline{W}$ outputted from the transfer gate control circuit 180 goes Low, and the PMOS transistor 222 and the NMOS transistor 223 in the transfer gate 220 are turned on and the CMOS inverter 221 is made operative, i.e., the transfer gate 220 is opened, permitting passage of signals therethrough.

When the input data Din is inputted, it is delayed by the data input delay circuit 200 for a predetermined time, and written through the transfer gate 220 onto the write data line 225. When transition occurs in the input data Din, the match detecting circuit 210 detects the mismatch between the input and the output of the data input delay circuit 200, and its output is made Low indicating a mismatch. The inverted internal write enable signal $\overline{W}$ outputted from the transfer gate control circuit 180 goes High and the transfer gate 220 is closed, preventing passage of signals therethrough, so that the write data DA that has been passing through the transfer gate 220 until this time point is amplified by the write amplifier 240 and sent to the data lines DLa and DLb through the inverters 104 and 105 in FIG. 1 and then written In the selected memory cell via the bit lines BLa and BLb.

Now let us consider a situation where, when transition occurs from the write cycle time $t_{wc}$ to the read cycle time $t_{rc}$, the inverted write enable signal $\overline{WE}$ is changed from write (Low) to read (High), and transition occurs in the input data Din ($t_{dh}=0$ ns).

First, when transition occurs in the input data Din, the match detecting circuit 210 outputs a mismatch signal (latch signal) LH of Low level, the transfer gate control circuit 180 outputs an inverted internal write enable signal $\overline{W}$ of High level, and the PMOS transistor 222 and the NMOS transistor 223 in the transfer gate 220 are turned off so that the CMOS inverter 22]is made inoperative. Responsive to the latch signal LH, the PMOS transistor 233 and the NMOS transistor 234 in the latch circuit 230 are turned on and the flip-flop 231 is made operative and thereby holds the write data DA of the preceding cycle on the write data line 225. As a result, the write data DA of the preceding cycle is held on the write data line 225 connected to the latch circuit 230.

Upon expiration of the delay time of the data input delay circuit 200, the match detecting circuit 210 produces a match detecting signal of High level. Then, the latch signal LH goes tilth and the latch circuit 230 is made inoperative, and the NAND gate 181 in the transfer gate control circuit 180 is "opened". The transfer gate 220 is closed for the input data delay time (the period for which the latch signal LH is Low), the inverted write enable signal $\overline{WE}$ is neglected.

The above described embodiment has the following advantages.

The write enable delay circuit 120 in the prior art of FIG. 3 is omitted and instead the match detecting circuit 210 is provided, and the function of the write enable circuit 120 is provided by the data input delay circuit 200. As a result, even if there is a slight shift in the timing of the inverted internal write enable signal $\overline{WE}$ and the input data Din, input is inhibited until the correct input data Din arrives at the transfer gate 220. As a result, stable operation is ensured while a sufficient data hold time $t_{dh}$ is secured. Consequently, erroneous writing can be prevented without fail.

Figure 10:
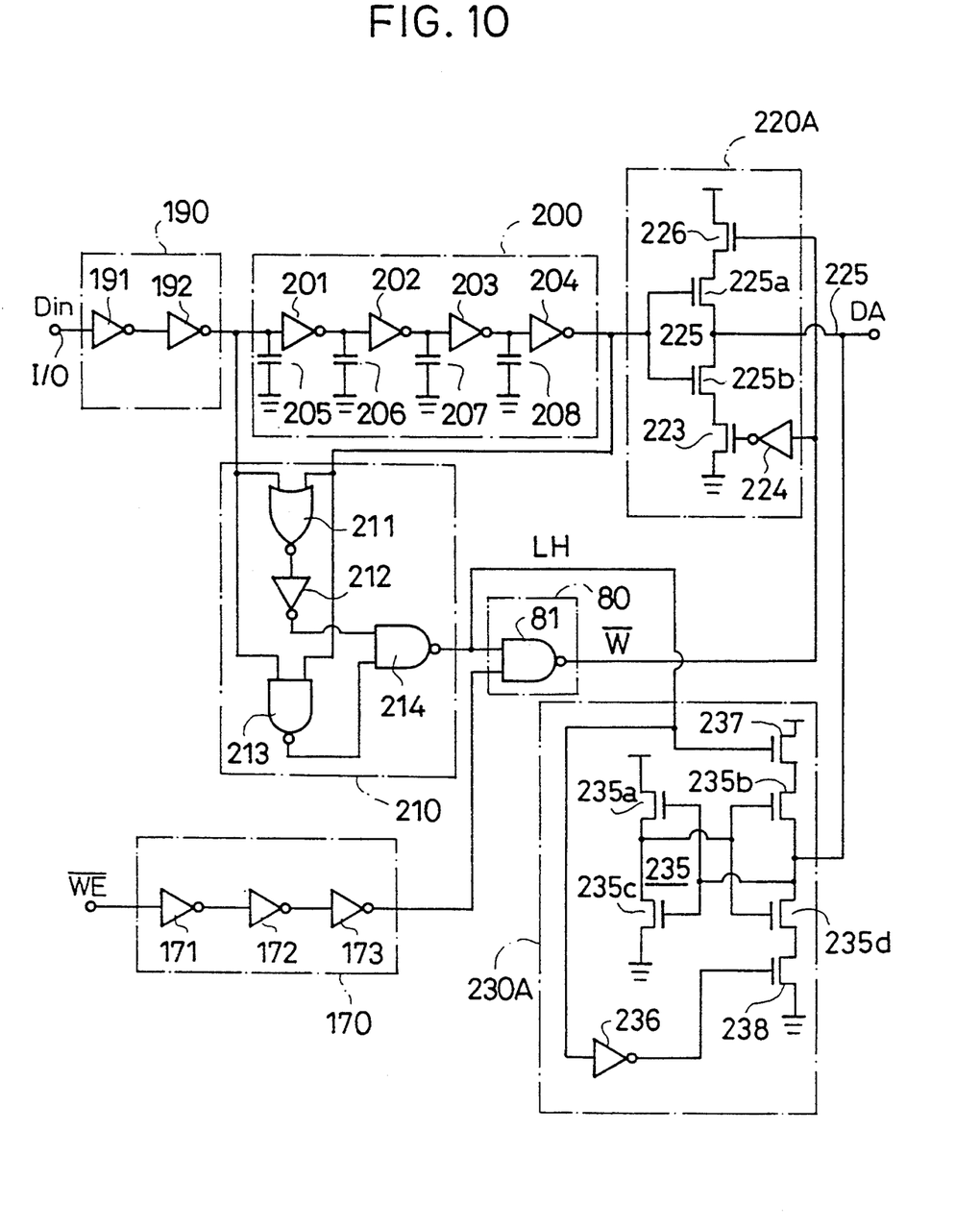
FIG. 10 is a diagram showing a write control circuit of a further embodiment of the invention.

FIG. 10 shows another example of the circuit used in place of the circuit of FIG. 8. The transfer gate circuit 220 and the latch circuit 230 are replaced by transfer gate circuit 220A and a latch circuit 230A of different configurations. The transfer gate circuit 220A comprises an inverter 224 comprising NMOS transistors 225a and 225b, in place of the CMOS inverter 221 shown in FIG. 8. The transfer gate circuit 220A is further provided with NMOS transistors 223 and 226 which turn on and off the inverter 225. The latch circuit 230A comprises a flip-flop 235 comprising four NMOS transistors 235a to 235d crossed-coupled with each other. The latch circuit 230A is further provided with an inverter 236 for inverting the latch signal LH, an NMOS transistor 237 whose gate is controlled by the latch signal LH, and another NMOS transistor 238 whose gate is controlled by the outpost of the inverter 236. The NMOS transistors 237 and 238 have the function of turning on and off the flip-flop 235. The circuits of FIG. 10 perform the operations similar to those performed by the circuits of FIG. 8.

In the embodiment described above, the semiconductor memory device is a static RAM, but the above embodiment is applicable to other types of memory devices as well. The memory cell matrix shown In FIG. 1 and the write control circuit shown in FIG. 8 may be other than those illustrated.

As has been described, in the reading circuit according to the invention, the control circuit detects the output data of the preceding read cycle, and the reset potential of the sense amplifier is set to be a first operating point VR1 or a second operating point VR2 depending on the result of the above detection. The first and the second operating points VR1 and VR2 are so set that VR1>Vth>VR2, where Vth is the threshold potential of the output circuit. As a result, the output circuit keeps outputting the output data of the preceding cycle. This is continued until the resetting is completed. Consequently, the erroneous output of the output data is prevented without fail, and the speed of the reading operation can thereby be increased. The output latch circuit operating during resetting and the output transfer gate can therefore be omitted. The circuit configuration can therefore be simplified.

As has been described, in the write control circuit according to the invention, the match detecting circuit is provided for detecting the match between the input and output of the data input delay circuit, and the output of the match detecting circuit is applied via the transfer gate control circuit to the transfer gate and is used to inhibit the operation of the transfer gate for a period when transition occurs in the input data, so that the latch circuit is made operative during this period, so that the write data of the preceding cycle is held for this period. As a result, even if there is a slight shift in the timing of the internal write enable signal produced from the transfer gate control circuit responsive to the write enable signal or its inversion, and the input data, the input is inhibited until the correct data arrives at the transfer gate. As a consequence, a sufficient data hold time is secured while stable operation is ensured, and erroneous writing is prevented without fall.

What is claimed is:

1. A semiconductor integrated circuit device comprising:
    a plurality of memory cells connected to a plurality of word lines (WL) and a plurality of pairs of bit lines which are selected in accordance with an address;
    a data input delay circuit for delaying write data to a selected memory cell, for a predetermined time, so that the write data are outputted simultaneously with activation of the word line;
    a transfer gate turned ON and OFF in accordance with a write enable signal or an inverted write enable signal and transferring the write data output from the data input delay circuit to the bit lines;

a match detecting circuit responsive to the input and output of the data input delay circuit and generating a match signal or a mismatch signal depending on whether or not the input and output of the data input delay circuit match each other;

a transfer gate control circuit for controlling the ON condition and OFF of the transfer gate in accordance with the output of the match detecting circuit; and a latch circuit for latching, for a predetermined time, the write data outputted from the transfer gate, when the output of the match detecting circuit indicates a mismatch.

2. A semiconductor integrated circuit device according to claim 1, wherein said transfer gate control circuit causes said transfer gate to be ON when the output of the match detecting circuit indicates a match, and to be OFF when the output of the match detecting circuit indicates a mismatch.

3. A semiconductor integrated circuit device according to claim 1, wherein said transfer gate control circuit is also responsive to the write enable control signal for causing said transfer gate to be ON when the output of said match detecting circuit indicates a match and said write enable signal is active.

4. A semiconductor integrated circuit device according to claim 1, wherein said latch circuit is connected to the output of said transfer gate, and maintains the data at the output of the transfer gate unchanged when the transfer gate is OFF and when the output of the match detecting circuit indicates a mismatch.

5. A semiconductor memory device according to claim 4, wherein said latch circuit terminates the latching operation when the output of the match detecting circuit is changed to indicate a match.

* * * * *